(12) United States Patent
Xie et al.

(10) Patent No.: US 10,488,962 B2
(45) Date of Patent: Nov. 26, 2019

(54) ORGANIC LIGHT-EMITTING DIODE DISPLAY DEVICE WITH TOUCH CONTROL FUNCTION AND MANUFACTURING METHOD THEREFOR

(71) Applicant: TRULY (HUIZHOU) SMART DISPLAY LIMITED, Huizhou, Guangdong (CN)

(72) Inventors: Zhisheng Xie, Huizhou (CN); Junhai Su, Huizhou (CN); Yaqing Huang, Huizhou (CN); Jianhua Li, Huizhou (CN)

(73) Assignee: TRULY (HUIZHOU) SMART DISPLAY LIMITED, Guangdong (CN)

(*) Notice: Subject to any disclaimer, the term of this patent is extended or adjusted under 35 U.S.C. 154(b) by 61 days.

(21) Appl. No.: 15/319,148

(22) PCT Filed: Jan. 4, 2015

(86) PCT No.: PCT/CN2015/070023
§ 371 (c)(1),
(2) Date: Dec. 15, 2016

(87) PCT Pub. No.: WO2015/192649
PCT Pub. Date: Dec. 23, 2015

(65) Prior Publication Data
US 2017/0123542 A1 May 4, 2017

(30) Foreign Application Priority Data

Jun. 16, 2014 (CN) .......................... 2014 1 0268262

(51) Int. Cl.
*G06F 3/041* (2006.01)
*G06F 3/042* (2006.01)
(Continued)

(52) U.S. Cl.
CPC .......... *G06F 3/0412* (2013.01); *G06F 3/0416* (2013.01); *G06F 3/0421* (2013.01);
(Continued)

(58) Field of Classification Search
CPC ................. G06F 3/0412; G06F 3/0416; G06F 2203/04103; G06F 3/0428; G06F 3/0421;
(Continued)

(56) References Cited

U.S. PATENT DOCUMENTS

2003/0184528 A1 10/2003 Kawasaki et al.
2004/0247934 A1* 12/2004 Takeuchi .............. H01L 51/004
428/690

(Continued)

FOREIGN PATENT DOCUMENTS

CN        1448833 A      10/2003
CN    101887904 A      11/2010
(Continued)

OTHER PUBLICATIONS

International Search Report for PCT/CN2015/070023 dated Apr. 1, 2015.

*Primary Examiner* — Temesghen Ghebretinsae
*Assistant Examiner* — Ivelisse Martinez Quiles
(74) *Attorney, Agent, or Firm* — Pearne & Gordon LLP

(57) ABSTRACT

Provided are an organic light-emitting diode display device with a touch control function and a manufacturing method therefor. The display device comprises multiple pixel units. Each pixel unit comprises a display area (101A), a detection area (101B), multiple organic light-emitting diode elements located in the display area (101A), and infrared light detection elements located in the detection area. The multiple organic light-emitting diode elements comprise at least one of a red light organic light-emitting diode element and a blue light organic light-emitting diode element, an infrared light (Continued)

organic light-emitting diode element and a green light organic light-emitting diode element. Compared with an infrared touch device in the prior art, the organic light-emitting diode display device with the touch control function is smaller in size.

12 Claims, 5 Drawing Sheets

(51) Int. Cl.
*H01L 27/32* (2006.01)
*H01L 51/56* (2006.01)
*H01L 21/77* (2017.01)
*H01L 51/00* (2006.01)
*H01L 27/12* (2006.01)
*H01L 29/786* (2006.01)

(52) U.S. Cl.
CPC ............ *G06F 3/0428* (2013.01); *H01L 21/77* (2013.01); *H01L 27/323* (2013.01); *H01L 27/3211* (2013.01); *H01L 27/3227* (2013.01); *H01L 27/3262* (2013.01); *H01L 51/56* (2013.01); *G06F 2203/04103* (2013.01); *H01L 27/1222* (2013.01); *H01L 29/78675* (2013.01); *H01L 51/0004* (2013.01); *H01L 51/0008* (2013.01); *H01L 2227/323* (2013.01)

(58) Field of Classification Search
CPC ... H01L 51/56; H01L 27/323; H01L 51/0004; H01L 51/0008; H01L 27/3211; H01L 27/3262; H01L 27/1222; H01L 2227/323; H01L 29/78675; H01L 27/3227; H01L 21/77; H01L 27/32
See application file for complete search history.

(56) References Cited

U.S. PATENT DOCUMENTS

| | | | |
|---|---|---|---|
| 2007/0242055 A1 | 10/2007 | Lai | |
| 2008/0121442 A1* | 5/2008 | Boer | G06F 3/0412 178/18.09 |
| 2011/0037729 A1* | 2/2011 | Cho | G06F 3/0412 345/175 |
| 2011/0043487 A1* | 2/2011 | Huang | G06F 3/0412 345/175 |
| 2011/0057189 A1* | 3/2011 | Jeong | G06F 3/0412 257/59 |
| 2012/0176298 A1* | 7/2012 | Suh | H01L 27/3234 345/82 |
| 2012/0242610 A1 | 9/2012 | Yasumatsu | |
| 2014/0346446 A1* | 11/2014 | Cheng | H01L 51/0085 257/40 |
| 2014/0354905 A1* | 12/2014 | Kitchens | G06F 1/3215 349/12 |
| 2015/0243712 A1* | 8/2015 | Wang | H01L 27/3227 257/40 |
| 2015/0331508 A1* | 11/2015 | Nho | G06F 3/0421 345/173 |
| 2015/0364527 A1* | 12/2015 | Wang | H01L 27/3225 257/40 |

FOREIGN PATENT DOCUMENTS

| | | | | |
|---|---|---|---|---|
| CN | 102592514 A | 7/2012 | | |
| CN | 102667678 A | 9/2012 | | |
| CN | 104009067 A | 8/2014 | | |
| KR | 20090065182 A | * | 6/2009 | ........... H01L 27/323 |
| KR | 20120106476 A | 9/2012 | | |

* cited by examiner

ORGANIC LIGHT-EMITTING DIODE DISPLAY DEVICE WITH TOUCH CONTROL FUNCTION AND MANUFACTURING METHOD THEREFOR

CROSS REFERENCES TO RELATED APPLICATIONS

This application is the national phase of International Application No. PCT/CN2015/070023, titled "ORGANIC LIGHT-EMITTING DIODE DISPLAY DEVICE WITH TOUCH CONTROL FUNCTION AND MANUFACTURING METHOD THEREFOR", and filed on Jan. 4, 2015, which claims the priority to Chinese Patent Application No. 201410268262.6, titled "ORGANIC LIGHT-EMITTING DIODE DISPLAY DEVICE WITH TOUCH CONTROL FUNCTION AND MANUFACTURING METHOD THEREFOR", filed on Jun. 16, 2014 with the State Intellectual Property Office of the People's Republic of China, which is incorporated herein by reference in its entirety.

TECHNICAL FIELD

The present disclosure relates to the technical field of touch display, and in particular to an organic light-emitting diode display device integrated with a touch control function and a manufacturing method therefor.

BACKGROUND

Mobile terminals such as computer and mobile phone, via which information sources are accessed, are developing. As touch screens are easy to use, robust, durable and space saving and have a rapid response speed, system designers are increasingly aware that utilization of touch screens can result in considerable advantages.

With the success of capacitive touch screens, human-machine interactions need to be implemented with a touch control function of a display. In order to achieve the touch function of the display with lower cost and with more convenience, the industry is continually seeking the best solution for integrating display with touch. As the capacitive touch screen technology matures, development space of the capacitive touch screen technology is limited. Gradually, optical touch screen technology has become a focus in the research.

An infrared touch screen is a common optical touch screen, which detects and locates a touch location of a user with an infrared matrix densely arranged in X and Y directions. As shown in FIG. 1, for a conventional infrared touch screen, a circuit board frame is arranged in front of a display, and infrared emitting elements 11 and infrared receiving elements 12 are arranged around the screen in the circuit board. Since the infrared emitting elements 11 and the infrared receiving elements 12 are in a one-to-one correspondence, an infrared matrix is formed in which rays can cross each other horizontally and vertically. When a user touches the screen, a finger blocks a horizontal infrared ray and a vertical infrared ray which pass a touch location 13. In this case, a location of a touch point on the screen can be determined. Any touching object may realize a touch operation by changing infrared rays which pass a touch point.

The inventors found that, while the infrared touch screen technology has been available for a long period of time, the development of infrared touch technology is affected by a large size and a high manufacture cost of the infrared touch screen.

SUMMARY

In view of the above, an organic light-emitting diode display device and a manufacturing method therefor, in which a display is integrated with an infrared light-emitting unit and an infrared light-receiving unit, are provided according to the present disclosure, to reduce a size and the manufacture cost of an infrared touch screen.

To achieve the above object, the following technical solutions are provided according to the present disclosure.

An organic light-emitting diode display device integrated with a touch control function is provided, the organic light-emitting diode display device includes multiple pixel units, and each of the multiple pixel units includes:

a substrate including a display region and a detection region;

multiple organic light-emitting diode components located in the display region of the substrate, where each of the multiple organic light-emitting diode components includes: a first transistor, a second transistor, a storage capacitor, a first electrode layer electrically connected to the second transistor, an organic light-emitting layer located on the first electrode layer, and a second electrode layer located on a surface of the organic light-emitting layer; and an infrared detection component located in the detection region of the substrate, where the infrared detection component includes: a third transistor, an infrared detection unit electrically connected to the third transistor, and the infrared detection unit includes: a first infrared detection electrode, an infrared sensing layer connected to the first infrared detection electrode, and a second infrared detection electrode connected to the infrared sensing layer;

where the multiple organic light-emitting diode components include at least one of a red organic light-emitting diode component and a blue organic light-emitting diode component, an infrared organic light-emitting diode component, and a green organic light-emitting diode component.

Preferably, a material system of the infrared sensing layer of the infrared detection unit includes any of a tellurium zinc cadmium mercury series, an aluminum gallium indium arsenic series, an indium gallium arsenic phosphorus series, an aluminum gallium indium phosphorus series, an indium gallium arsenic antimony series, an aluminum gallium arsenic antimony series or a silicon germanium series.

Preferably, the infrared detection unit is any of a PIN photodiode, a heterojunction phototransistor, an avalanche photodiode, a quantum well infrared detector, a quantum cascade infrared detector and a superlattice infrared detector.

Preferably, material of the organic light-emitting layer of the infrared organic light-emitting diode component is a triplet compound of rare metals.

Preferably, material of the organic light-emitting layer of the infrared organic light-emitting diode component is an Ir (III) compound.

Preferably, each of the multiple pixel units includes a red organic light-emitting diode component, a blue organic light-emitting diode component, a green organic light-emitting diode component and an infrared organic light-emitting diode component, and the red organic light-emitting diode component, the green organic light-emitting diode component and the blue organic light-emitting diode component are in an RGB strip arrangement.

Preferably, each of the multiple pixel units includes a red organic light-emitting diode component, a blue organic light-emitting diode component, a green organic light-emitting diode component and an organic infrared light-emitting diode component, and the red organic light-emitting diode component, the green organic light-emitting diode component and the blue organic light-emitting diode component are in an RGB staggered arrangement.

A manufacturing method for an organic light-emitting diode display device integrated with a touch control function is further provided, and the manufacturing method includes:

providing a substrate, where the substrate includes at least one pixel region, and each of the at least one pixel region includes a display region and a detection region;

forming a first transistor and a second transistor in the display region of each of the at least one pixel region, and forming a third transistor, and a first infrared detection electrode and a second infrared detection electrode of a detection unit, in the detection region of each of the at least one pixel region;

forming a first conductive film on the second transistor, and patterning the first conductive film to form a first electrode layer of an organic light-emitting diode component, where the first electrode layer is located in the display region, and is connected to the second transistor.

forming an infrared sensing film on the third transistor; and patterning the infrared sensing film to form an infrared sensing layer, where the infrared sensing layer is located in the detection region, and is connect to the third transistor;

forming a dielectric layer on a region in the display region except the first electrode layer, and on the infrared sensing layer in the detection region;

forming a patterned organic light-emitting layer on the first electrode layer; and forming a second conductive film on the patterned organic light-emitting layer and the dielectric layer, and patterning the second conductive film to form a second electrode layer, where the second electrode layer is located on the patterned organic light-emitting layer.

Preferably, steps for forming the first transistor, the second transistor and the third transistor include:

forming a patterned polycrystalline silicon layer in each of the display region and the detection region of the substrate;

forming a gate insulating layer, to cover the patterned polycrystalline silicon layers and the substrate;

forming multiple source regions or drain regions in the polycrystalline silicon layers;

forming a gate on a surface of the gate insulating layer above each of the patterned polycrystalline silicon layers;

forming an interlayer insulating layer on the gate and the surface of the gate insulating layer;

etching the interlayer insulating layer and the gate insulating layer, to form multiple first holes in the multiple source regions or the multiple drain regions;

forming a patterned source conductive layer or a patterned drain conductive layer in the multiple first holes and on a part of the interlayer insulating layer;

forming a protective layer on the patterned source conductive layer or the patterned drain conductive layer, and on the interlayer insulating layer; and etching the protective layer, to form multiple second holes on the patterned source conductive layer or the patterned drain conductive layer.

Preferably, the organic light-emitting layer may include a red light-emitting layer, a green light-emitting layer, a blue light-emitting layer or an infrared light-emitting layer, and a process for forming the patterned organic light-emitting layer on the first electrode layer may be an evaporation process or a printing process.

Preferably, the first conductive film is a transparent conductive film, and the second conductive film is a metal conductive film.

Preferably, the first conductive film is a metal conductive film, and the second conductive film is a transparent conductive film.

It can be seen from the above technical solutions that, in the organic light-emitting diode display device integrated with the touch control function according to the present disclosure, each pixel of an OLED display panel is integrated with the infrared organic light-emitting diode component for emitting infrared light and the infrared detection component for receiving infrared light. When a pixel of the OLED display panel operates normally, an infrared organic light-emitting diode in the pixel also emits light. When a finger or other object approaches the pixel, the infrared light emitted by the infrared organic light-emitting diode is reflected to an infrared detection unit in the pixel. After receiving the infrared light, the infrared detection unit is turned on and then determines a touch location. In this way, display and touch functions are achieved.

In the OLED display device integrated with the touch control function according to the present disclosure, formation of the infrared organic light-emitting diode component and the infrared detection component, and formation of the red organic light-emitting diode component, the green organic light-emitting diode component and the blue organic light-emitting diode component in the OLED display panel, are at the same time. That is, the infrared organic light-emitting diode component and the infrared detection component are integrated in the OLED display panel. Compared with a conventional infrared touch device formed by providing a circuit board in an external of a display and further providing an infrared emitting element and an infrared receiving element in the external of the display, the organic light-emitting diode display device integrated with the touch control function according to the present disclosure has a smaller size.

In addition, the manufacturing method for the organic light-emitting diode display device integrated with the touch control function is further provided according to the present disclosure. The method only needs to change a pattern of lithography or add a film structure in a process of manufacturing red sub-pixels, green sub-pixels and blue sub-pixels of the OLED display panel, without the need of adding an external circuit board, multiple infrared emitting elements, and multiple infrared receiving elements. Therefore, manufacture cost of an infrared touch screen is reduced.

BRIEF DESCRIPTION OF THE DRAWINGS

In order to illustrate technical solutions in embodiments of the present disclosure or in the conventional technology more clearly, drawings used in the description of the embodiments or the conventional technology are introduced briefly hereinafter. Apparently, the drawings described hereinafter merely illustrate some embodiments of the present disclosure, and other drawings may be obtained by those skilled in the art based on these drawings without any creative efforts.

DETAILED DESCRIPTION

Figure 1:
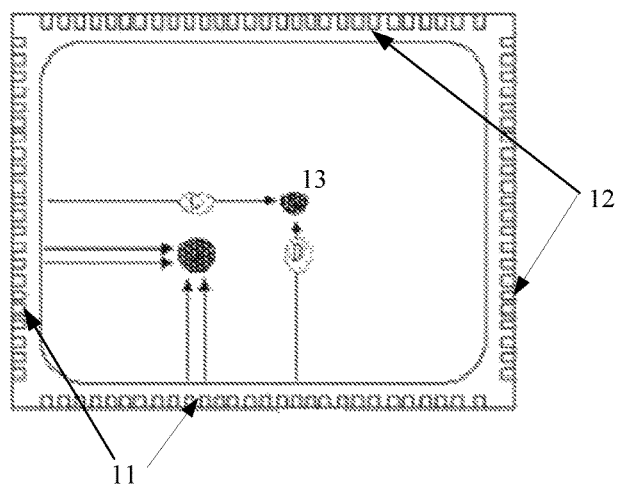
FIG. 1 is a diagram of a conventional display device with an infrared touch control function.

As described in the background, the conventional infrared touch screen has a large size and a high manufacture cost, which seriously affects the development of infrared touch technology.

The inventors found that, the phenomenon described above is due to a fact that the conventional infrared touch screen includes two independent systems, i.e., the display and an infrared touch control system. That is, the conventional infrared touch screen includes the display and the multiple infrared emitting elements and the multiple infrared receiving elements which are located in an external of the display. On the one hand, the display and the circuit board for achieving infrared touch control are of separated structure, which results in the large size of the infrared touch screen. On the other hand, the circuit board, the infrared emitting elements and the infrared receiving elements need to be fixed on a periphery of the display, which results in the high manufacture cost.

In view of the above, an organic light-emitting diode display device integrated with a touch control function is provided. The organic light-emitting diode display device includes multiple pixel units. Each of the multiple pixel units includes: a substrate, multiple organic light-emitting diode components, and an infrared detection component.

The substrate includes a display region and a detection region.

The multiple organic light-emitting diode components are located in the display region of the substrate. Each of the multiple organic light-emitting diode components includes: a first transistor, a second transistor, a storage capacitor, a first electrode layer electrically connected to the second transistor, an organic light-emitting layer located on the first electrode layer, and a second electrode layer located on a surface of the organic light-emitting layer.

The infrared detection component is located in the detection region of the substrate. The infrared detection component includes: a third transistor, and an infrared detection unit electrically connected to the third transistor. The infrared detection unit includes: a first infrared detection electrode, an infrared sensing layer connected to the first infrared detection electrode, and a second infrared detection electrode connected to the infrared sensing layer.

The multiple organic light-emitting diode components include at least one of a red organic light-emitting diode component and a blue organic light-emitting diode component, an infrared organic light-emitting diode component, and a green organic light-emitting diode component.

It can be seen from the above technical solution that, the OLED display device according to the present disclosure is integrated with the organic light-emitting diode component that can emit infrared light and the infrared detection units that can receive infrared light, instead of an infrared emitting element and an infrared receiving element in the conventional technology. Therefore, the OLED display device can have an infrared touch control function. In addition, since the infrared organic light-emitting diode component and the infrared detection unit are integrated in the OLED display device, the size is reduced.

Above described is an idea of the present disclosure. The technical solutions in embodiments of the present disclosure are clearly and completely described hereinafter in conjunction with the drawings in the embodiments of the present disclosure. Apparently, the described embodiments are only a few rather than all of the embodiments of the invention. All other embodiments obtained by those skilled in the art based on the embodiments of the present disclosure without any creative efforts fall within the protection scope of the present disclosure.

For full understanding of the present disclosure, specific details are described in the following descriptions. The present disclosure may be implemented in other manners different from those described herein, and similar promotions can be made by those skilled in the art without departing from the essence of the present disclosure. Hence, the present disclosure is not limited by the embodiments disclosed in the following.

The present disclosure is described in detail in conjunction with schematic diagrams. To facilitate describing the embodiments of the present disclosure, sectional views of a device structure may be partially enlarged in an abnormal proportion. In addition, the schematic diagrams are only for illustration, and do not limit the protection scope of the present disclosure. In practical manufacture, three-dimensional sizes, i.e., length, width and depth, should be involved.

An organic light-emitting diode display device integrated with a touch control function and a manufacturing method therefor according to the present disclosure are described hereinafter in conjunction with some embodiments.

An organic light-emitting diode display device integrated with a touch control function is provided according to an embodiment of the present disclosure. The organic light-emitting diode display device includes multiple pixel units. Each of the multiple pixel units includes: a substrate, multiple organic light-emitting diode components, and an infrared detection component. The substrate includes a display region and a detection region. The multiple organic light-emitting diode components are located in the display region of the substrate. Each of the multiple organic light-emitting diode components includes: a first transistor, a second transistor, a storage capacitor, a first electrode layer electrically connected to the second transistor, an organic light-emitting layer located on the first electrode layer, and a second electrode layer located on a surface of the organic light-emitting layer. The infrared detection component is located in the detection region of the substrate. The infrared detection component includes: a third transistor, and an infrared detection unit electrically connected to the third transistor. The infrared detection unit includes: a first infrared detection electrode, an infrared sensing layer connected to the first infrared detection electrode, and a second infrared detection electrode connected to the infrared sensing layer. The multiple organic light-emitting diode components include at least one of a red organic light-emitting diode component and a blue organic light-emitting diode component, an infrared organic light-emitting diode component, and a green organic light-emitting diode component.

Figure 2:
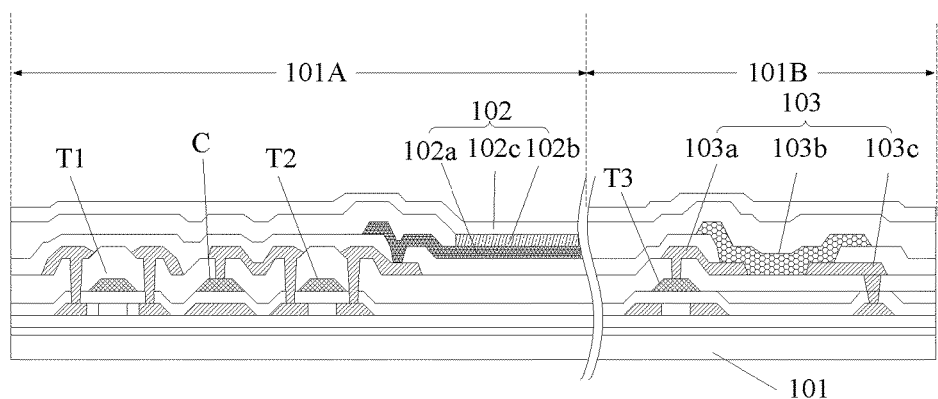
FIG. 2 is a schematic sectional view of an OLED display device integrated with a touch control function according to the present disclosure.

Reference is made to FIG. 2, which shows an organic light-emitting diode component and an infrared detection unit of a pixel unit of an organic light-emitting diode display device integrated with a touch control function according an embodiment.

The organic light-emitting diode component is located in a display region 101A of a substrate 101. The organic light-emitting diode component includes a first transistor T1, a second transistor T2, a storage capacitor C and an organic light-emitting diode structure 102. The organic light-emitting diode structure includes a first electrode layer 102a electrically connected to the second transistor T2, an organic light-emitting layer 102b located on the first electrode layer 102a, and a second electrode layer 102c located on a surface of the organic light-emitting layer 102b.

It should be noted that, the OLED display device according to the embodiment may be a top-emitting OLED display device or a bottom-emitting OLED display device, which is not limited by the embodiment. In a case that the OLED display device is a top-emitting OLED display device, the first electrode layer 102a is of metal conductive material with high reflectivity, the metal conductive material may be platinum (Pt), palladium (Pd), iridium (Ir), gold (Au), tungsten (W), nickel (Ni), silver (Ag) or aluminum (Al), the second electrode layer is a transparent electrode, and the transparent electrode may be a film of transparent conductive material such as indium tin oxide (ITO) or indium zinc oxide (IZO). In this case, an exit direction of light emitted by the light-emitting layer of OLED emits is from the first electrode layer 102a to the second electrode layer 102c.

In a case that the OLED display device is a bottom-emitting OLED display device, the first electrode layer 102a is a transparent electrode layer, and the second electrode layer 102c is a metal conductive layer with high reflectivity. As a result, an exit direction of light emitted by the light-emitting layer of OLED is from the second electrode layer 102c to the first electrode layer 102a, forming the bottom-emitting OLED.

In addition, the organic light-emitting layer 102b of the organic light-emitting diode structure 102 according to the embodiment may be any of a red organic light-emitting layer, a green organic light-emitting layer, a blue organic light-emitting layer and an infrared organic light-emitting layer. For an organic light-emitting layer which emits red light, green light or blue light, material of the light-emitting layer according to the embodiment may be the same as material of an organic light-emitting layer in the conventional technology. In the embodiment, material of the infrared organic light-emitting layer is preferably a triplet compound of rare metals. More preferably, the material of the infrared organic light-emitting layer is an Ir (III) compound. It should be noted that, the material of the infrared organic light-emitting layer according to the embodiment is not limited to the triplet compound of rare metals described above, and may be other materials that can emit infrared light, which is not described herein.

When the OLED display device is in operation, the first transistor T1 in the organic light-emitting diode component serves as a switch transistor, and the second transistor T2 serves as a drive transistor. A source of the first transistor T1 is connected to a data line, a gate of the first transistor T1 is connected to a gate line, and a drain of the first transistor T1 is connected to a terminal of a capacitor component and to a gate of the second transistor. A source of the second transistor T2 is connected to the first electrode layer 102a of the organic light-emitting diode structure 102. In the embodiment, the first electrode layer 102a is an anode of the OLED structure. A red sub-pixel, a green sub-pixel, a blue sub-pixel and an infrared sub-pixel in each of the multiple pixel units are controlled, in response to pulse signals of the data line and gate line, to emit light or to be turned off.

In addition, a detection region of the OLED display device according to the embodiment further includes an infrared detection unit 103 configured to detect infrared light. As shown in FIG. 2, the infrared detection unit includes a third transistor T3, an infrared detection unit electrically connected to the third transistor T3. The infrared light detection unit includes a first infrared detection electrode 103a, an infrared sensing layer 103b connected to the first infrared detection electrode 103a, and a second infrared detection electrode 103c connected to the infrared sensing layer 103b. The third transistor T3 is a readout transistor. When infrared is incident on the infrared detection unit, the infrared detection unit is turned on, and generates a detection signal, and the detection signal is transmitted to a detection signal line of a peripheral circuit via the third transistor T3. As a result, the infrared touch control function of OLED is achieved.

A material system of the infrared sensing layer in the infrared detection unit includes any of a tellurium zinc cadmium mercury series, an aluminum gallium indium arsenic series, an indium gallium arsenic phosphorus series, an aluminum gallium indium phosphorus series, an indium gallium arsenic antimony series, an aluminum gallium arsenic antimony series or a silicon germanium series. The infrared detection unit is any of a PIN photodiode, a heterojunction phototransistor, an avalanche photodiode, a quantum well infrared detector, a quantum cascade infrared detector and a super-lattice infrared detector.

Figure 3:
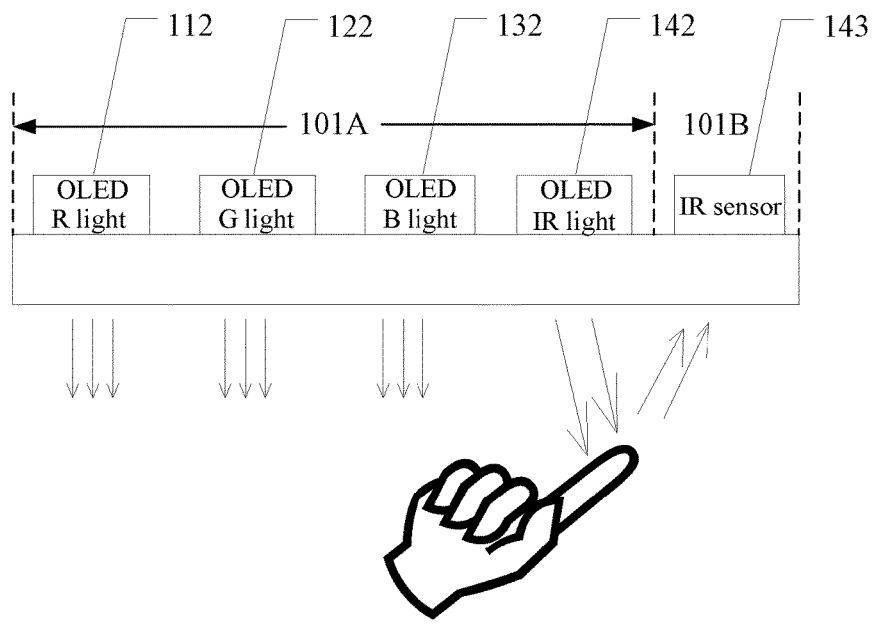
FIG. 3 is a diagram of an operation principle of an OLED display device integrated with a touch control function according to the present disclosure.

FIG. 3 is a diagram of an operation principle of an OLED display device according to an embodiment. A pixel unit of the OLED display device includes a red organic light-emitting diode component 112, a green organic light-emitting diode component 122, a blue organic light-emitting diode component 132, an infrared organic light-emitting diode component 142, and an infrared detection unit 143. When an infrared organic light-emitting diode structure is controlled, via a peripheral circuit, to emit infrared light, and a display image is clicked at a location of a pixel unit of the OLED display device by a finger or other object, infrared light emitted by the infrared organic light-emitting diode component 142 in the clicked pixel unit is reflected to the infrared detection unit 143 in the pixel. The infrared detection unit 143 receives the infrared light and absorbs the infrared light with a specific wavelength. As a result, electrodes of two terminals of the infrared detection unit 143 are turned on. Therefore, it is determined that the pixel is selected by touching, and an infrared touch control function is achieved.

Figure 4:
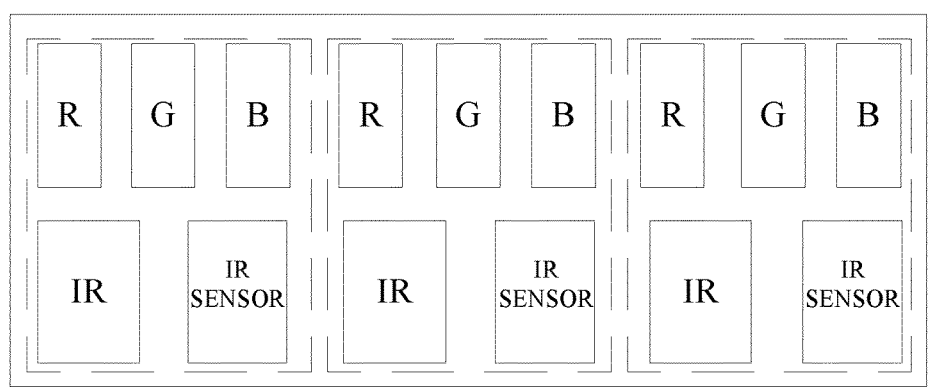
FIG. 4 is an arrangement diagram of sub-pixels in pixel units of an OLED display device integrated with a touch control function according to the present disclosure.
Figure 5:
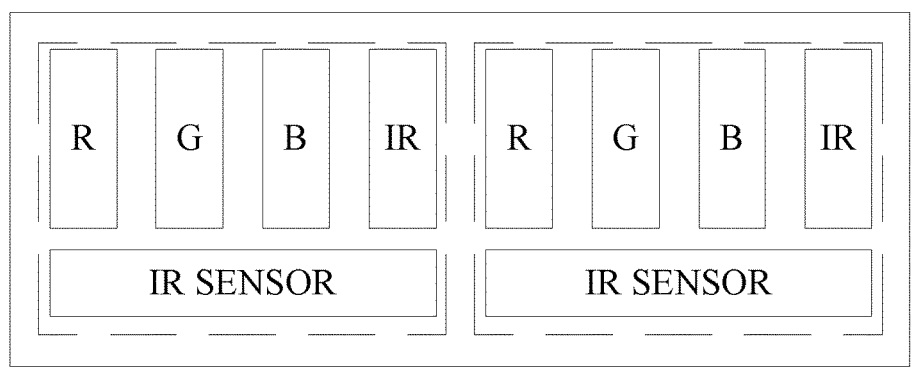
FIG. 5 is an arrangement diagram of sub-pixels in pixel units of another OLED display device integrated with a touch control function according to the present disclosure.

It should be noted that, the pixel unit of the OLED display device according to the embodiment includes sub-pixels with three primary colors, i.e., red, green and blue, an infrared sub-pixel and the infrared detection unit. That is, each pixel unit includes a red organic light-emitting diode component, a blue organic light-emitting diode component, a green organic light-emitting diode component, an infrared organic light-emitting diode component, and an infrared detection unit. An arrangement of the red organic light-emitting diode component, the green organic light-emitting diode component and the blue organic light-emitting diode component is not limited by the embodiment. The red organic light-emitting diode component, the green organic light-emitting diode component and the blue organic light-emitting diode component may be in an RGB strip arrangement or an RGB staggered arrangement. In addition, relative positions of the infrared organic light-emitting diode component, the infrared detection unit and the organic light-emitting diode components with three primary colors RGB are not limited by the embodiment. An arrangement may be as shown in FIG. 3 in which the infrared organic light-emitting diode component and the infrared detection unit are located at one side of the red organic light-emitting diode component, the blue organic light-emitting diode component and the green organic light-emitting diode component, or, the infrared organic light-emitting diode component and the infrared detection unit may be respectively located at two sides of the organic light-emitting diode components with three primary colors RGB. Or, other arrangements may be adopted, as shown in FIG. 4 and FIG. 5, which are not limited by the embodiment.

The OLED display device integrated with the touch control function is provided according to the embodiment. The OLED display device includes the multiple pixel units. Each of the multiple pixel units includes the display region and the detection region. The display region of each of the multiple pixel units further includes the infrared organic light-emitting diode component, besides the red organic light-emitting diode component, the green organic light-emitting diode component and the blue organic light-emitting diode component in the conventional technology. The detection region includes the infrared detection unit. When a finger or other object touches a pixel unit, infrared light emitted by the infrared organic light-emitting diode component can be reflected to the infrared detection unit. The two electrodes of the infrared detection unit are turned on after receiving the infrared light. As a result, a touch location is determined, and the infrared touch control function is achieved.

The OLED display device according to the embodiment is integrated with the organic light-emitting diode component that can emit infrared light and the infrared detection unit that can receive infrared light, instead of an infrared emitting element and an infrared receiving element in the conventional technology. Therefore, the OLED display device can have the infrared touch control function. In addition, since the infrared light organic light-emitting diode component and infrared detection unit are integrated in the OLED display device, the size is reduced.

Figure 6:
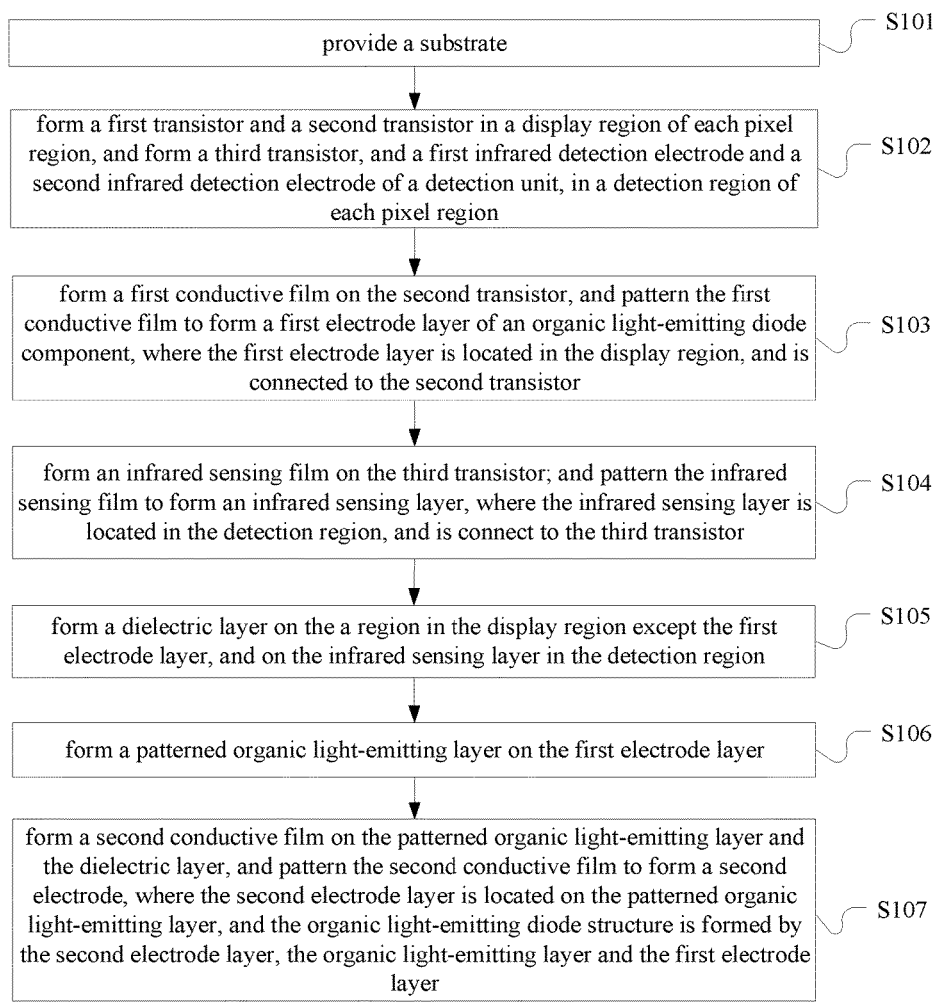
FIG. 6 is a diagram of steps of a manufacturing method for an OLED display device integrated with a touch control function according to the present disclosure.

A manufacturing method for an organic light-emitting diode display device integrated with a touch control function is provided according to another embodiment of the present disclosure. The manufacturing method includes steps S101 to S107, as shown in FIG. 6.

In step S101, a substrate is provided.

The substrate is a transparent substrate, preferably, a glass substrate. The substrate includes at least one pixel region. Each of the at least one pixel region includes a display region and a detection region. It should be noted that, a black matrix layer needs to be formed on the substrate, and the black matrix layer is configured to block an opaque component in the OLED display device.

In step S102, a first transistor and a second transistor are formed in the display region of each of the at least one pixel region; and a third transistor, and a first infrared detection electrode and a second infrared detection electrode of a detection unit are formed in the detection region of each of the at least one pixel region.

Preferably, the first transistor, the second transistor, and the third transistor may be thin film transistors. The thin film transistors may be polycrystalline silicon thin film transistors, amorphous silicon thin film transistors, or oxide thin film transistors, which is not limited by the embodiment. In the embodiment, an example in which the first transistor, the second transistor, and the third transistor are polycrystalline silicon thin film transistors is described.

Figure 7:
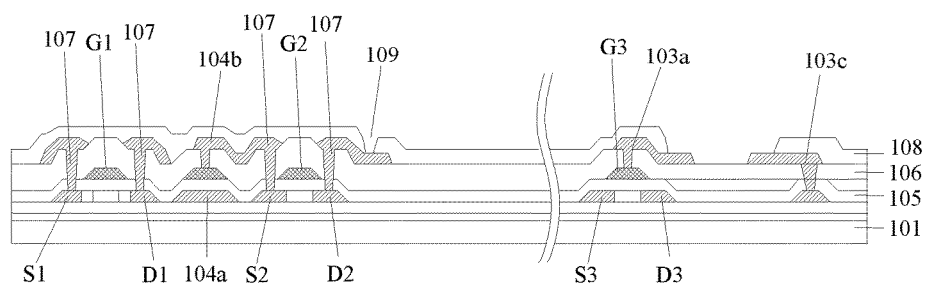
FIG. 7 to FIG. 9 are diagrams of a part of process for an OLED display device integrated with a touch control function according to the present disclosure.

As shown in FIG. 7, a process of forming the polycrystalline silicon thin film transistors includes: forming a polycrystalline silicon layer on the substrate 101, and forming a patterned polycrystalline silicon layer in each of the display region and the detection region of the substrate through processes such as masking and etching; covering a part of the polycrystalline silicon layer by using a mask, and performing doping on an exposed part, to form source regions or drain regions (a source region S1 and a drain region D1 of the first transistor T1, a source region S2 and a drain region D2 of the second transistor T2, and a source region S3 and a drain region D3 of the third transistor T3) and to form an electrode 104a of a capacitor; depositing insulating material to form a gate insulating layer 105, to cover the patterned polycrystalline silicon layer and the substrate; depositing a layer of gate material on the gate insulation layer 105 to form a gate layer, forming a gate (shown as G1, G2 and G3 in the figure), through processes such as masking and etching, on a surface of gate insulating layer above each of the polycrystalline silicon layers correspondingly, and forming another electrode 104b of the capacitor; forming an interlayer insulating layer 106 on the formed gate and the gate insulating layer 105; etching the interlayer insulating layer 106 and the gate insulating layer 105, to form multiple first holes in the multiple source regions or the multiple drain regions; depositing a conductive layer on the interlayer insulating layer in which the multiple first holes are formed, and patterning, through processes such as masking and etching, the conductive layer, to form a patterned source conductive layer or a patterned drain conductive layer 107 in the multiple first holes and a part of the insulating interlayer, and to form the first infrared detection electrode 103a and the second infrared detection electrode 103c; forming a protective layer 108 on the patterned source conductive layer or the patterned drain conductive layer and on the interlayer insulating layer; and etching the protective layer to form multiple second holes 109 on the patterned source conductive layer or the patterned drain conductive layer, so as to enable the second transistor and the third transistor to form an electrical connection with an organic light-emitting diode structure formed subsequently.

The first infrared detection electrode and the second infrared detection electrode of the infrared detection unit are formed at the same time as the source conductive layer and the drain conductive layer, all of which are formed by processes such as deposition, masking and etching that are not described in the embodiment. In addition, the first infrared detection electrode and the second infrared detection electrode of the infrared detection unit may be of the same material as the source conductive layer and the drain conductive layer. In other embodiments, the first infrared detection electrode and the second infrared detection electrode of the infrared detection unit may be of material different from material of the source conductive layer and the drain conductive layer.

In this way, all of the capacitor component, the first thin film transistor, the second thin film transistor and the third thin film transistor are formed on the substrate. The first thin film transistor and the second thin film transistor are located in the display region, and may serve as a switch thin film transistor (switch TFT) and a drive thin film transistor (drive TFT) respectively. The third thin film transistor is located in the detection region, and may serve as a readout thin film transistor (readout TFT). In the embodiment, the first, second and third thin film transistor are low-temperature polycrystalline silicon (LTPS) film transistors, which does not limit the present disclosure.

In step S103, a first conductive film is formed on the second transistor, and the first conductive film is patterned to form a first electrode layer of an organic light-emitting diode component. The first electrode layer is located in the display region, and is connected to the second transistor.

Figure 8:
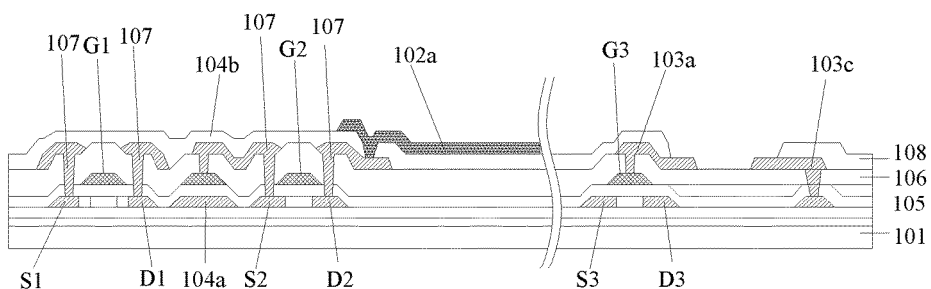

As shown in FIG. 8, the first conductive film is formed on the protective layer of the source conductive layer or the drain conductive layer of the second transistor through processes such as masking and etching. The first conductive film is connected to the drain D2 of the second transistor via the second holes 109 formed in step S102. In addition, the first conductive film is patterned to form the first electrode layer 102a of the organic light-emitting diode component. The first electrode layer may be of transparent conductive material or may be of metal conductive material with high reflectivity. That is, the first conductive film may be a transparent conductive film or a metal conductive film, which is not limited by the embodiments.

In step S104, an infrared sensing film is formed on the third transistor; and the infrared sensing film is patterned to form an infrared sensing layer. The infrared sensing layer is located in the detection region, and is connect to the third transistor.

Figure 9:
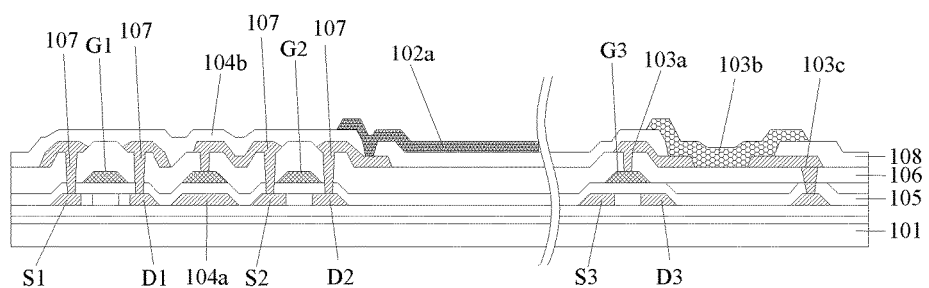

As shown in FIG. 9, the infrared sensing film is formed at the same time as the first electrode layer of the organic light-emitting diode component. The infrared sensing film is patterned, through processes such as masking and etching, to form the infrared sensing layer 103b. The infrared sensing layer is electrically connected to the gate G3 of the third transistor via the first infrared detection electrode 103a.

In the present embodiment, a material system of the infrared sensing layer includes any of a tellurium zinc cadmium mercury series, an aluminum gallium indium arsenic series, an indium gallium arsenic phosphorus series, an aluminum gallium indium phosphorus series, an indium gallium arsenic antimony series, an aluminum gallium arsenic antimony series or a silicon germanium series.

Step S105: a dielectric layer is formed on a region of the display region except the first electrode layer, and on the infrared sensing layer in the detection region.

While forming an organic light-emitting layer, the dielectric layer is formed on the region of the display region except the first electrode layer, i.e., on a remaining region of the display region except first electrode layer, to protect other devices in the display region. In addition, the dielectric layer is formed on the infrared sensing layer in the detection region, The dielectric layer covers the infrared sensing layer, to protect the infrared sensing layer.

Step S106: a patterned organic light-emitting layer is formed on the first electrode layer.

The organic light-emitting layer may include a red light-emitting layer, a green light-emitting layer, a blue light-emitting layer and an infrared light-emitting layer. A process for forming the organic light-emitting layer may be an evaporation process or a printing process. Material of the organic light-emitting layer varies with a light color of a sub-pixel in each pixel unit. For an infrared light-emitting diode component, the material of the organic light-emitting layer is a triplet compound of rare metals. In the embodiment, the material of the organic light-emitting layer of a red organic light-emitting diode component, a green organic light-emitting diode component and a blue organic light-emitting diode component is not limited.

Step S107: a second conductive film is formed on the patterned organic light-emitting layer and the dielectric layer. The second conductive film is patterned to form a second electrode layer. The second electrode layer is located on the patterned organic light-emitting layer. The organic light-emitting diode structure is formed by the second electrode layer, the organic light-emitting layer and the first electrode layer.

In addition, in the organic light-emitting diode structure, a hole transporting layer (or an electron transporting layer) is provided between the first electrode layer and the organic light-emitting layer, and an electron transporting layer (or a hole transporting layer) is provided between the second electrode layer and the organic light-emitting layer. The hole transporting layer may be an NPB (organic molecular material containing nitrogen) layer, which is not limited in the embodiment.

It should be noted that, in the present embodiment, each pixel unit includes multiple light-emitting sub-pixels in the process of forming the organic light-emitting diode display device. Only one of the light-emitting sub-pixels is taken as an example for illustration in the embodiment. In a practical manufacturing process, the multiple light-emitting sub-pixels in each pixel unit are formed at the same time. The same process is not described in the embodiment.

Further, in order to protect components from moisture corrosion, a protective layer may be formed (not shown in the drawings) to cover the second electrode layer and the dielectric layer. The protective layer may be silicon oxide and/or silicon nitride layer formed by a deposition method or a spin coating method.

The manufacturing method for the organic light-emitting diode display device integrated with the touch control function is provided according to the embodiment. A manufacturing process of the infrared organic light-emitting diode component is the same as that of conventional organic light-emitting diode components with three primary colors in a process of manufacturing a conventional OLED display device. In addition, a manufacturing process of the infrared detection unit is compatible with the manufacturing process of the OLED display device. In manufacturing the OLED display device according to the embodiment, the method only needs to change a pattern of lithography or add a film structure, without the need of adding an external circuit board, multiple infrared emitting elements, and multiple infrared receiving elements. Therefore, manufacture cost of an infrared touch screen is reduced. In addition, the OLED display device according to embodiment is integrated with an infrared emitting device and an infrared receiving device without increasing a size of the OLED display device, thus achieving an infrared touch control function.

The various sections of the present disclosure are described in a progressive way, differences from other sections are emphatically illustrated in each of the sections, and reference can be made to each other for understanding the same or similar sections. The above descriptions of the disclosed embodiments enable those skilled in the art to implement or use the present disclosure. Various changes to the embodiments are obvious to those skilled in the art, and general principles defined herein may be implemented in other embodiments without departing from the spirit or scope of the present disclosure. Therefore, the invention is not limited to the embodiments disclosed herein but is to conform to the widest scope consistent with the principles and novel features disclosed herein.

What is claimed is:

1. An organic light-emitting diode display device integrated with a touch control function, comprising a plurality of pixel units, wherein each of the plurality of pixel units comprises:
   a substrate comprising a display region and a detection region;
   a plurality of organic light-emitting diode components located in the display region of the substrate, wherein each of the plurality of organic light-emitting diode components comprises: a first transistor, a second transistor, a storage capacitor, a first electrode layer electrically connected to the second transistor, an organic light-emitting layer located on the first electrode layer, and a second electrode layer located on a surface of the organic light-emitting layer; and
   an infrared detection component located in the detection region of the substrate, wherein the infrared detection component comprises: a third transistor and an infrared detection unit, the infrared detection unit comprises: a first infrared detection electrode, an infrared sensing layer connected to the first infrared detection electrode, and a second infrared detection electrode connected to the infrared sensing layer, wherein the first infrared detection electrode and the second infrared detection electrode are arranged in a same layer, a gate of the third transistor is electrically connected to the first infrared detection electrode;
   wherein the plurality of organic light-emitting diode components comprise a red organic light-emitting diode component, a blue organic light-emitting diode component, an infrared organic light-emitting diode component and a green organic light-emitting diode component, the plurality of organic light-emitting diode components and the infrared detection unit are formed at a same time.

2. The organic light-emitting diode display device according to claim 1, wherein a material system of the infrared sensing layer of the infrared detection unit comprises any of a tellurium zinc cadmium mercury series, an aluminum gallium indium arsenic series, an indium gallium arsenic phosphorus series, an aluminum gallium indium phosphorus series, an indium gallium arsenic antimony series, an aluminum gallium arsenic antimony series or a silicon germanium series.

3. The organic light-emitting diode display device according to claim 1, wherein the infrared detection unit is any of a PIN photodiode, a heterojunction phototransistor, an avalanche photodiode, a quantum well infrared detector, a quantum cascade infrared detector and a superlattice infrared detector.

4. The organic light-emitting diode display device according to claim 1, wherein material of the organic light-emitting layer of the infrared organic light-emitting diode component is a triplet compound of rare metals.

5. The organic light-emitting diode display device according to claim 1, wherein material of the organic light-emitting layer of the infrared organic light-emitting diode component is an Ir (III) compound.

6. The organic light-emitting diode display device according to claim 1, wherein the red organic light-emitting diode component, the green organic light-emitting diode component and the blue organic light-emitting diode component are in a red, green and blue (RGB) strip arrangement.

7. The organic light-emitting diode display device according to claim 1, wherein the red organic light-emitting diode component, the green organic light-emitting diode component and the blue organic light-emitting diode component are in a red, green and blue (RGB) staggered arrangement.

8. A manufacturing method for an organic light-emitting diode display device integrated with a touch control function, the manufacturing method comprising:
   providing a substrate, wherein the substrate comprises at least one pixel region, and each of the at least one pixel region comprises a display region and a detection region;
   forming a first transistor and a second transistor in the display region of each of the at least one pixel region, and forming a third transistor, a first infrared detection electrode and a second infrared detection electrode of a detection unit, in the detection region of each of the at least one pixel region, wherein the first infrared detection electrode and the second first infrared detection electrode are formed in a same layer, a gate of the third transistor is electrically connected to the first infrared detection electrode;
   forming a first conductive film on the second transistor, and patterning the first conductive film to form a first electrode layer of an organic light-emitting diode component, where the first electrode layer is located in the display region, and is connected to the second transistor;
   forming an infrared sensing film on the third transistor; and patterning the infrared sensing film to form an infrared sensing layer, wherein the infrared sensing layer is located in the detection region, and is connect to the third transistor;
   forming a dielectric layer on a region in the display region except the first electrode layer, and on the infrared sensing layer in the detection region;
   forming a patterned organic light-emitting layer on the first electrode layer, wherein the patterned organic light-emitting layer comprises a red light-emitting layer, a green light-emitting layer, a blue light-emitting layer and an infrared light-emitting layer; and forming a second conductive film on the patterned organic light-emitting layer and the dielectric layer, and patterning the second conductive film to form a second electrode layer, wherein the second electrode layer is located on the patterned organic light-emitting layer.

9. The manufacturing method according to claim 8, wherein steps for forming the first transistor, the second transistor and the third transistor comprises:
   forming a patterned polycrystalline silicon layer in each of the display region and the detection region of the substrate;
   forming a gate insulating layer, to cover the patterned polycrystalline silicon layers and the substrate;
   forming a plurality of source regions or a plurality of drain regions in the polycrystalline silicon layers;
   forming a gate on a surface of the gate insulating layer above each of the patterned polycrystalline silicon layers;
   forming an interlayer insulating layer on the gate and the surface of the gate insulating layer;
   etching the interlayer insulating layer and the gate insulating layer, to form a plurality of first holes in the plurality of source regions or the plurality of drain regions;

forming a patterned source conductive layer or a patterned drain conductive layer in the plurality of first holes and a part of the interlayer insulating layer;

forming a protective layer on the patterned source conductive layer or the patterned drain conductive layer, and on the interlayer insulating layer; and etching the protective layer, to form a plurality of second holes on the patterned source conductive layer or the patterned drain conductive layer.

10. The manufacturing method according to claim 8, wherein a process for forming the patterned organic light-emitting layer on the first electrode layer is an evaporation process or a printing process.

11. The manufacturing method according to claim 8, wherein the first conductive film is a transparent conductive film, and the second conductive film is a metal conductive film.

12. The manufacturing method according to claim 8, wherein the first conductive film is a metal conductive film, and the second conductive film is a transparent conductive film.

\* \* \* \* \*